US012765151B2

(12) United States Patent
Zhou et al.

(10) Patent No.: US 12,765,151 B2
(45) Date of Patent: Oct. 13, 2026

(54) DISPLAY MODULES AND DISPLAY DEVICES

(71) Applicant: Wuhan China Star Optoelectronics Semiconductor Display Technology Co., Ltd., Wuhan (CN)

(72) Inventors: Weilong Zhou, Wuhan (CN); Liang Sun, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 18/546,298

(22) PCT Filed: Jun. 29, 2023

(86) PCT No.: PCT/CN2023/104260
§ 371 (c)(1),
(2) Date: Aug. 14, 2023

(87) PCT Pub. No.: WO2024/259745
PCT Pub. Date: Dec. 26, 2024

(65) Prior Publication Data

US 2026/0123147 A1 Apr. 30, 2026

(30) Foreign Application Priority Data

Jun. 21, 2023 (CN) ......................... 202310749163.9

(51) Int. Cl.
*H10H 29/80* (2025.01)
*H10H 29/39* (2025.01)

(52) U.S. Cl.
CPC ........ *H10H 29/8321* (2025.01); *H10H 29/39* (2025.01)

(58) Field of Classification Search
CPC ........................... H10H 29/39; H10H 29/8321
See application file for complete search history.

(56) References Cited

U.S. PATENT DOCUMENTS 11,527,513 B2 12/2022 Chae
2020/0259050 A1* 8/2020 Wu .................... H10H 20/8316

FOREIGN PATENT DOCUMENTS

CN 114793476 A 7/2022
CN 115064528 A 9/2022

OTHER PUBLICATIONS

Indian Office Action issued in corresponding Indian Patent Application No. 202317073578 dated Mar. 30, 2026, pp. 1-7.

* cited by examiner

*Primary Examiner* — Steven M Page
(74) *Attorney, Agent, or Firm* — Nathan & Associates Patent Agents Ltd.; Menachem Nathan

(57) ABSTRACT

The present application discloses a display panel and a display device. Each of light emitting devices includes at least two sub light emitting devices arranged in a first direction perpendicular to a substrate. A plurality of independent electrodes are respectively connected to the sub light emitting devices. Each of at least two common electrodes is disposed between adjacent ones of the light emitting devices, where the common electrodes are respectively connected to the sub light emitting devices, one of the common electrodes and one of the independent electrodes are located on different sides of each of the sub light emitting devices, and each of the sub light emitting devices is electrically connected to at least one of the common electrodes.

20 Claims, 8 Drawing Sheets

DISPLAY MODULES AND DISPLAY DEVICES

TECHNICAL FIELD

The present application relates to the field of display technologies, and more particularly to a display module and a display device.

BACKGROUND

An inorganic light emitting diode is a solid-state light source having high brightness and high luminous efficiency. In the field of display technologies, it is mainly used as both a backlight source for a liquid crystal display and an outdoor full color display. Compared with a liquid crystal display and an organic light emitting diode display, an inorganic light emitting diode display has advantages of low power consumption, fast response and high light efficiency, and has great commercial value in the technical fields of a high resolution display, virtual reality and augmented reality.

Currently, in order to realize other color or full color display of the inorganic light emitting diodes, it is often necessary to stack a plurality of inorganic light emitting diodes together in a horizontal stacking or a vertical stacking manner, where the vertical stacking has an advantage of significantly improving Pixels Per Inch (PPI) compared with the horizontal stacking. However, in order to realize the vertical stacking of the plurality of inorganic light emitting diodes, it is often necessary to form a step on the side of the plurality of inorganic light emitting diode devices stacked vertically to accommodate a common electrode. However, if the size of the step is too large, an arrangement space of the inorganic light emitting diode devices is reduced, and if the size of the step is too small, difficulty of the process of accommodating the common electrode is increased and the yield of the common electrode is reduced.

SUMMARY

An embodiment of the present application provides a display module and a display device, which can avoid setting of the step, reduce difficulty of the process of accommodating the common electrode, improve yield of the common electrode, and improve device performance.

An embodiment of the present application provides a display module, including a substrate and a light emitting functional layer disposed on the substrate, where the light emitting functional layer includes:

a plurality of light emitting devices, where each of the light emitting devices includes at least two sub light emitting devices arranged in a first direction perpendicular to the substrate;

a plurality of independent electrodes respectively connected to the sub light emitting devices; and at least two common electrodes disposed between adjacent ones of the light emitting devices, where the number of the common electrodes is greater than or equal to the number of the sub light emitting devices in each of the light emitting devices;

where the common electrodes are respectively connected to the sub light emitting devices in the first direction, one of the common electrodes and one of the independent electrodes are located on different sides of each of the sub light emitting devices, and each of the sub light emitting devices is electrically connected to at least one of the common electrodes.

In an embodiment of the present application, each of the light emitting devices includes a first sub light emitting device and a second sub light emitting device arranged in the first direction, the plurality of independent electrodes include a first independent electrode and a second independent electrode, and the at least two common electrodes include one or more first common electrodes and one or more second common electrodes; and where the first independent electrode and one of the first common electrodes are connected to different sides of the first sub light emitting device, and the second independent electrode and one of the second common electrode are connected to different sides of the second sub light emitting device.

In an embodiment of the present application, each of the light emitting devices further includes a third sub light emitting device located on one side of the first sub light emitting device or one side of the second sub light emitting device in the first direction, the plurality of independent electrodes include a third independent electrode connected to the third sub light emitting device, the plurality of common electrodes include one or more third common electrodes each connected to the third sub light emitting device in the first direction, and the third common electrodes, the first common electrodes, and the second common electrodes are connected to each other.

In an embodiment of the present application, the number of the first common electrodes, the number of the second common electrodes, and the number of the third common electrodes are all greater than or equal to 1.

In an embodiment of the present application, the plurality of light emitting devices are arranged in a second direction and a third direction both parallel to the substrate, the first common electrodes extend in the second direction and/or the third direction, the second common electrodes extend in the second direction and/or the third direction, and the third common electrodes extends in the second direction and/or the third direction.

In an embodiment of the present application, the first sub light emitting device is located between the substrate and the second sub light emitting device, the third sub light emitting device is located on a side of the second sub light emitting device away from the first sub light emitting device, a thickness of each of the first common electrodes in the first direction is greater than a thickness of each of the second common electrodes in the first direction, and a thickness of each of the third common electrodes in the first direction is less than the thickness of the second common electrode in the first direction.

In an embodiment of the present application, the substrate includes a driving circuit unit, and the light emitting functional layer further includes a first bonding layer disposed between the substrate and the first sub light emitting device, a second bonding layer disposed between the first sub light emitting device and the second sub light emitting device, a third bonding layer disposed between the second sub light emitting device and the third sub light emitting device, and a cover layer disposed on a side of the third sub light emitting device away from the second sub light emitting device; and where each of the first common electrodes passes through the cover layer, the third bonding layer, and the second bonding layer in the first direction and is connected to the first sub light emitting device, each of the second common electrodes passes through the cover layer and the third bonding layer in the first direction and is connected to the second sub light emitting device, each of the third common electrodes passes through the cover layer in the first direction and is connected to the third sub light emitting device, and the first common electrodes, the second common electrodes, and the third common electrodes are all connected to the driving circuit unit.

In an embodiment of the present application, the light emitting functional layer further includes a first connection member connected between adjacent ones of the first sub light emitting devices, a second connection member connected between adjacent ones of the second sub light emitting devices, and a third connection member connected between adjacent ones of the third sub light emitting devices, and each of the first common electrodes is connected to the first connection member, each of the second common electrodes is connected to the second connection member, and each of the third common electrodes is connected to the third connection member; and where the first connection member is connected between any two adjacent ones of the first sub light emitting devices, the second connection member is connected between adjacent ones of a portion of the second sub light emitting devices, and the third connection member is connected between adjacent ones of a portion of the third sub light emitting devices.

In an embodiment of the present application, the light emitting functional layer includes a plurality of first blocks and a plurality of second blocks, each of the first blocks includes a plurality of second sub light emitting devices and the second connection member connected between the adjacent ones of the second sub light emitting devices, and each of the second blocks includes a plurality of third sub light emitting devices and the third connection member connected between the adjacent ones of the third sub light emitting devices; and where each of the first common electrodes is located between the adjacent ones of the first blocks and between adjacent ones of the second blocks, and each of the second common electrodes is located between adjacent ones of the second blocks.

In an embodiment of the present application, the first bonding layer is multiplexed as a first bottom electrode, and the light emitting functional layer further includes a second bottom electrode disposed between the second bonding layer and the second sub light emitting device, and a third bottom electrode disposed between the third bonding layer and the third sub light emitting device, and the first sub light emitting device is disposed on the first bottom electrode, the second sub light emitting device is disposed on the second bottom electrode, and the third sub light emitting device is disposed on the third bottom electrode; and where each of the first common electrodes is connected to the first bottom electrode, each of the second common electrodes is connected to the second bottom electrode, and each of the third common electrodes is connected to the third bottom electrode.

In an embodiment of the present application, a light emitting color of the first sub light emitting device is red, a light emitting color of the second sub light emitting device is green, and a light emitting color of the third sub light emitting device is blue.

In an embodiment of the present application, the second bonding layer includes a first Bragg reflective layer to transmit a red light and reflect a blue light.

In an embodiment of the present application, the third bonding layer includes a second Bragg reflective layer to transmit a red light and a green light and reflect a blue light.

In an embodiment of the present application, a width of an orthographic projection of each of the first common electrodes on the substrate is greater than a width of an orthographic projection of each of the second common electrodes on the substrate, and the width of the orthographic projection of the second common electrode on the substrate is greater than a width of an orthographic projection of each of the third common electrodes on the substrate.

In an embodiment of the present application, an orthographic projection of the third sub light emitting device on the substrate is located within an orthographic projection of the first sub light emitting device on the substrate, or the orthographic projection of the third sub light emitting device on the substrate coincides with the orthographic projection of the first sub light emitting device on the substrate;

where an orthographic projection of the third sub light emitting device on the substrate is located within an orthographic projection of the first sub light emitting device on the substrate, or the orthographic projection of the third sub light emitting device on the substrate coincides with the orthographic projection of the first sub light emitting device on the substrate.

In an embodiment of the present application, one or more sides of each of the sub light emitting devices is provided with the common electrodes.

In an embodiment of the present application, the number of the common electrodes is plural, and the plurality of common electrodes are connected to each other to form a mesh structure.

According to the above objects of the present application, another embodiment of the present application further provides a display device, including a device body and a display module, where the display module is integrated with the device body; and where the display module includes a substrate and a light emitting functional layer disposed on the substrate, and the light emitting functional layer includes:

a plurality of light emitting devices, where each of the light emitting devices includes at least two sub light emitting devices arranged in a first direction perpendicular to the substrate;

a plurality of independent electrodes respectively connected to the sub light emitting devices; and at least two common electrodes each disposed between adjacent ones of the light emitting devices, where the number of the common electrodes is greater than or equal to the number of the sub light emitting devices in each of the light emitting devices;

where the common electrodes are respectively connected to the sub light emitting devices in the first direction, one of the common electrodes and one of the independent electrodes are located on different sides of each of the sub light emitting devices, and each of the sub light emitting devices is electrically connected to at least one of the common electrodes.

In an embodiment of the present application, each of the light emitting devices includes a first sub light emitting device and a second sub light emitting device arranged in the first direction, the plurality of independent electrodes include a first independent electrode and a second independent electrode, and the at least two common electrodes include one or more first common electrodes and one or more second common electrodes; and where the first independent electrode and one of the first common electrodes are connected to different sides of the first sub light emitting device, and the second independent electrode and one of the second common electrodes are connected to different sides of the second sub light emitting device.

In an embodiment of the present application, each of the light emitting devices further includes a third sub light emitting device located on one side of the first sub light emitting device or one side of the second sub light emitting device in the first direction, the plurality of independent electrodes include a third independent electrode connected to the third sub light emitting device, the plurality of common electrodes include one or more third common electrodes each connected to the third sub light emitting device in the first direction, and the third common electrodes, the first common electrodes, and the second common electrodes are connected to each other.

Beneficial Effects

In the present application, each of the common electrodes is provided between adjacent ones of the light emitting devices and connected to at least one of the sub light emitting devices in the first direction Y, so that the connection between the common electrode and the at least one sub light emitting device is implemented, thereby avoiding arrangement of the step in the light emitting device and reducing the difficulty of the process of accommodating the common electrode. Further, the yield of the display module can be improved, and the performance of the display module can be improved. In addition, in the present application, it is not necessary to form the step at the side of the light emitting device and leave a gap at the step to keep a distance from the common electrode, and the common electrode and the independent electrode are located on different sides of the sub light-emitting device. Therefore, the present application can effectively improve the light emitting area of the light emitting device and the opening ratio.

BRIEF DESCRIPTION OF THE DRAWINGS

Technical solutions and other beneficial effects of the present application are apparent below from detailed description of the embodiments of the present application in combination with the accompanying drawings.

DETAILED DESCRIPTION

Figure 1:
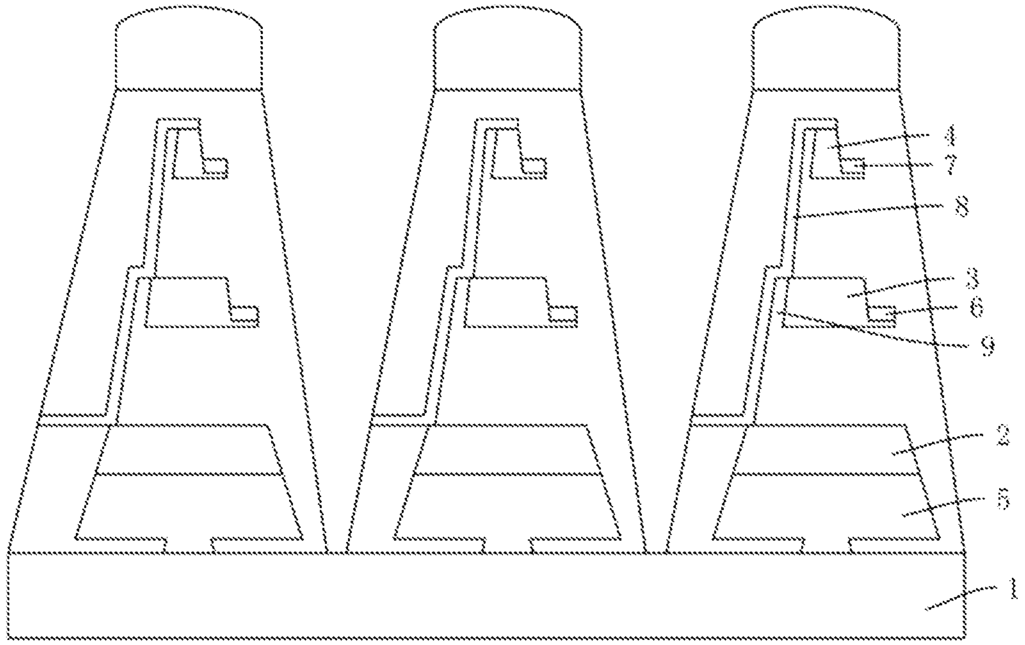
FIG. 1 is a schematic structural diagram of a display module in the related art.

In the following detailed description, only certain embodiments of the present application are shown and described by way of illustration only. As can be understood by those skilled in the art that the embodiments described herein may be modified in a variety of ways without departing from the spirit or scope of the present application.

In the drawings, thickness of layers, films, plates, regions, etc., may be enlarged for clarity and for a better understanding and ease of description. It should be understood that, when an element such as a layer, a film, a region, or a substrate is referred to as "on" another element, it may be located directly on another element or there may also be an intervening element therebetween.

In addition, the terms "including" and variations such as "includes" or "included" should be understood to imply the inclusion of the elements discussed, but not necessarily to the exclusion of other elements, unless specifically defined otherwise. Further, in the description, the term "on" means being placed above or below a portion of an object, not necessarily on the upper side of the portion of the object based on the direction of gravity.

It should be understood that, although the terms "first", "second", etc. can be used to describe various components herein, these components should not be restricted by these terms. These components are used only to distinguish one component from another.

As used herein, the singular forms "a", "an", and "the" are also intended to include the plural form, unless the context explicitly states otherwise.

It should also be understood that the terms "including" and/or "containing" as used herein specify the presence of said features or components, but do not exclude the presence or addition of one or more other features or components.

It should be understood that, when a layer, a region, or a part is said to be "formed on" another layer, region, or part, it may be directly or indirectly formed on another layer, region, or part. For example, an intermediate layer, region, or component may be present therebetween.

In the following example, an x-axis, a y-axis, and a z-axis are not limited to three axes of a rectangular coordinate system, and can be explained in a broader sense. For example, the x-axis, the y-axis, and the z-axis may be perpendicular to each other, or may represent different directions that are not perpendicular to each other.

Referring to FIG. 1, in a vertically stacked Light Emitting Diode (LED) display module, stacked first LED 2, second LED 3, and third LED 4 are usually sequentially formed on a substrate 1, and each of the LEDs needs to be connected to an independent electrode and a common electrode 8. For example, the first LED 2 is connected to a first independent electrode 5, the second LED 3 is connected to a second independent electrode 6, the third LED 4 is connected to a third independent electrode 7, and all of the first LED 2, the second LED 3, and the third LED 4 further need to be connected to the common electrode 8 to realize light emission. However, since the common electrode 8 is located on the side of the stacked three LED, a step needs to be etched at each of the LEDs to accommodate the common electrode 8 while a space 9 needs to be left between the LED and the common electrode 8 to avoid interference and interference. If the size of the step is too large, an arrangement space, a light emitting area, and an opening rate of the LEDs are reduced. If the size of the step is too small, the difficulty of the process of accommodating the common electrode 8 is increased and the yield of the common electrode 8 is reduced. Therefore, the process of manufacturing the display module shown in FIG. 1 is relatively limited, and it is difficult to meet the development of the display technologies.

Referring to FIGS. 2-7, an embodiment of the present application provides a display module, including a substrate 10 and a light emitting functional layer disposed on the substrate 10, where the light emitting functional layer includes a plurality of light emitting devices 20, a plurality of independent electrodes 30, and at least two common electrodes 40.

Each of the light emitting devices 20 includes at least two sub light emitting devices arranged in a first direction Y perpendicular to the substrate 10. The plurality of independent electrodes 30 are respectively connected to the sub light emitting devices. Each of the at least two common electrodes 40 is disposed between adjacent ones of the light emitting devices 20, where the number of the common electrodes is greater than or equal to the number of the sub light emitting devices in each of the light emitting devices 20.

Further, the common electrodes 40 are respectively connected to the sub light emitting devices in the first direction Y, one of the common electrodes 40 and one of the independent electrodes 30 are located on different sides of each of the sub light emitting devices, and each of the sub light emitting devices is electrically connected to at least one of the common electrodes 40.

In the process of implementation and application of the display module according to the embodiment of the present application, each of the common electrodes 40 is provided between adjacent ones of the light emitting devices 20 and connected to at least one of the sub light emitting devices in the first direction Y, so that the connection between the common electrode 40 and the at least one sub light emitting device is implemented, thereby avoiding arrangement of the step in the light emitting device 20 and reducing the difficulty of the process of accommodating the common electrode. Further, the yield of the display module can be improved, and the performance of the display module can be improved. In addition, in the embodiment of the present application, it is not necessary to form the step at the side of the light emitting device 20 and leave a gap at the step to keep a distance from the common electrode 40, and the common electrode 40 and the independent electrode 30 are located on different sides of the sub light emitting device. Therefore, the embodiment of the present application can effectively improve the light emitting area and the opening ratio of the light emitting device 20.

Specifically, still referring to FIGS. 2 to 7, the display module provided in an embodiment of the present application includes a substrate 10 and a light emitting functional layer disposed on the substrate 10.

The light emitting functional layer includes a plurality of light-emitting devices 20 disposed on the substrate 10, where a driving circuit unit (not shown) is further disposed on the substrate 10 and may include a thin film transistor device or a Complementary Metal-Oxide-Semiconductor (CMOS) transistor device, and a signal line, and the light emitting devices 20 are connected to the driving circuit unit to perform transmission of an electric signal and a light emitting control process for the light emitting devices 20.

The number of the sub light emitting devices in each of the light emitting devices 20 is greater than or equal to two, and the number of the common electrodes 40 is greater than or equal to the number of the sub light emitting devices in one of the light emitting devices 20. For example, if the number of the sub light emitting devices in the one light emitting device 20 is two, the number of the common electrodes 40 needs to be greater than or equal to two. Alternatively, if the number of the sub light emitting devices in the one light emitting device 20 is three, the number of the common electrode 40 needs to be greater than or equal to three.

In one embodiment, each of the light emitting devices 20 includes a first sub light emitting device 21, a second sub light emitting device 22, and a third sub light emitting device 23 arranged sequentially in the first direction Y perpendicular to the substrate 10. That is, the first sub light emitting device 21 is located between the second sub light emitting device 22 and the substrate 10, and the third sub light emitting device 23 is located on the side of the second sub light emitting device 22 away from the first sub light emitting device 21.

The light emitting functional layer further includes a first bonding layer 51 disposed between the substrate 10 and the first sub light emitting device 21, a second bonding layer 52 disposed between the first sub light emitting device 21 and the second sub light emitting device 22, a third bonding layer 53 disposed between the second sub light emitting device 22 and the third sub light emitting device 23, and a cover layer 54 disposed on the side of the third sub light emitting device 23 away from the second sub light emitting device 22. The first sub light emitting device 21 is disposed on the first bonding layer 51 and connected to the substrate 10 by the first bonding layer 51. The second sub light emitting device 22 is disposed on the second bonding layer 52 and connected to the side of the first sub light emitting device 21 away from the substrate 10 by the second bonding layer 52. The third sub light emitting device 23 is disposed on the third bonding layer 53 and connected to the side of the second sub light emitting device 22 away from the first sub light emitting device 21 by the third bonding layer 53.

In one embodiment, the material of the first bonding layer 51 may include a metal material, and the metal material has a light-reflecting function, so that an emergent light of the light emitting device 20 toward the substrate 10 can be reflected while the first sub light emitting device 21 is bonded, thereby improving the light emergent efficiency of the light emitting device 20. The materials of the second bonding layer 52, the third bonding layer 53, and the cover layer 54 may include a silicon oxide material such that the second bonding layer 52 and the third bonding layer 53 are transparent film layers. Therefore, the light emergent effect of the light emitting device 20 is not affected while the second sub light emitting device 22 and the third sub light emitting device 23 are bonded.

It should be noted that, in one embodiment, the substrate 10 may be a silicon substrate, and the driving circuit unit may be disposed on the substrate 10. In this case, the first sub light emitting device 21 may be directly connected to the substrate 10 by the first bonding layer 51. In addition, in another embodiment, the display module may further include a driving circuit layer disposed between the substrate 10 and the light emitting functional layer, and the driving circuit unit is disposed in the driving circuit layer. In this case, the first sub light emitting device 21 may be connected to the driving circuit layer by the first bonding layer 51.

The light emitting functional layer further includes one or more independent electrodes 30 and one or more common electrodes 40 connecting the light emitting devices 20 with the driving circuit unit to realize signal transmission.

The independent electrodes 30 include a first independent electrode 31 connected to the first sub light emitting device 21, a second independent electrode 32 connected to the second sub light emitting device 22, and a third independent electrode 33 connected to the third sub light emitting device 23. The first independent electrode 31, the second independent electrode 32, and the third independent electrode 33 may be connected to different switching transistors in the driving circuit unit, such as thin film transistors or CMOS transistors, respectively, to realize independent control of the first sub light emitting device 21, the second sub light emitting device 22, and the third sub light emitting device 23.

Each of the common electrodes 40 is disposed between adjacent ones of the light emitting devices 20, and the common electrodes 40 include one or more first common electrodes 41, one or more second common electrodes 42, and one or more third common electrodes 43 extending in a direction parallel to the substrate 10. Each of the first common electrodes 41 is connected to the first sub light emitting device 21 in the first direction Y, each of the second common electrodes 42 is connected to the second sub light emitting device 22 in the first direction Y, and each of the third common electrodes 43 is connected to the third sub light emitting device 23 in the first direction Y. The first common electrodes 41, the second common electrodes 42, and the third common electrodes 43 are connected to each other, that is, the first common electrodes 41, the second common electrodes 42, and the third common electrodes 43 may be integrally formed.

In the embodiment of the present application, the first common electrodes 41, the second common electrodes 42, and the third common electrodes 43 are respectively connected to the first sub light emitting devices 21, the second sub light emitting devices 22, and the third sub light emitting devices 23 in the first direction Y, so that arrangement of the step can be avoided, the connection of each of the first sub light emitting devices 21, the second sub light emitting devices 22, and the third sub light emitting devices 23 to the common electrodes 40 can be realized, the difficulty of the process of accommodating the common electrodes is reduced. Further, the yield of the display module can be improved, and the performance of the display module can be improved. In addition, in the embodiment of the present application, it is not necessary to form the step at the side of the light emitting device 20 and leave a gap at the step to keep a distance from the common electrodes 40. Therefore, the embodiment of the present application can effectively improve the light emitting area and the opening ratio of the light emitting device 20.

It should be noted that, with respect to the display module shown in FIG. 1, in the process of forming the stacked LEDs, it is still necessary to provide a gap between adjacent ones of the stacked LEDs. However, in the embodiment of the present application, each of the above-mentioned common electrodes 40 may be provided in the gap between the adjacent ones of the light emitting devices 20, and no additional space is required to dispose the common electrodes 40. Therefore, the embodiment of the present application can further increase the light emitting area of the light emitting devices 20 and improve the opening ratio of the light emitting devices 20.

Figure 2:
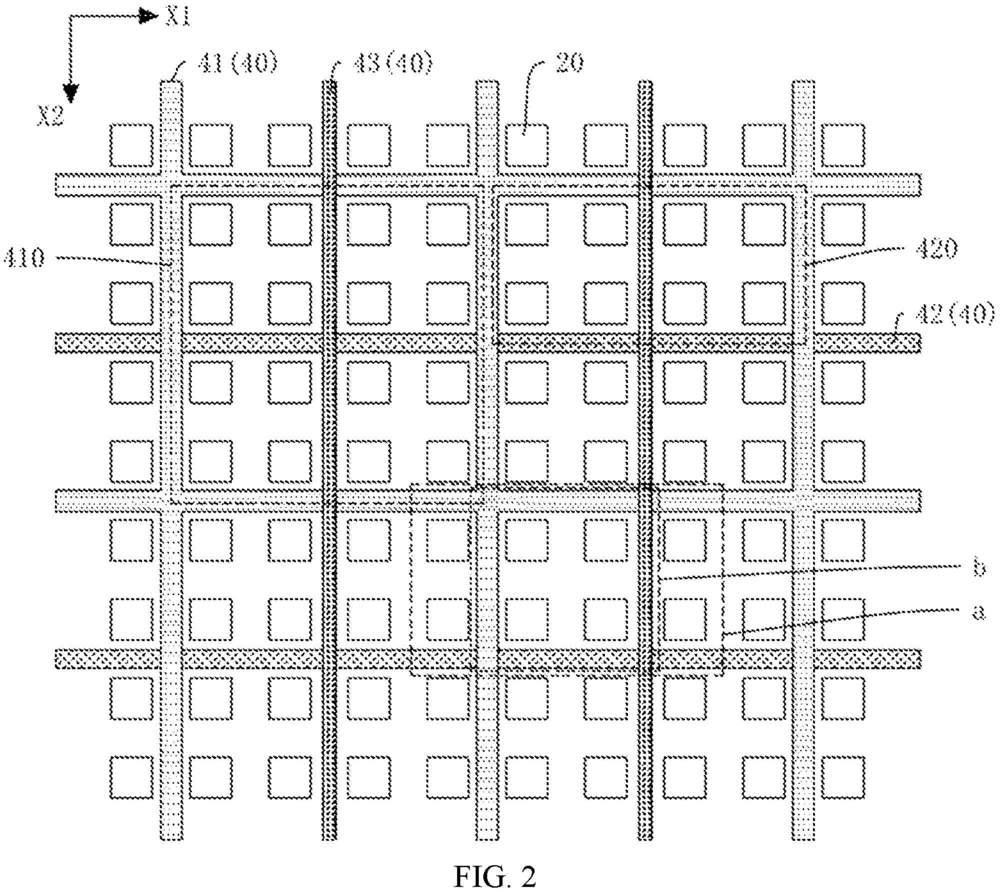
FIG. 2 is a schematic plan view of a display module according to an embodiment of the present application.

In one embodiment, the plurality of light emitting devices 20 are arranged in an array in a second direction X1 and a third direction X2 parallel to the substrate 10, as shown in FIG. 2.

Each of the first common electrodes 41 is located between adjacent ones of the light emitting devices 20 and may extend in the second direction X1 and/or the third direction X2. Each of the second common electrodes 42 is located between adjacent ones of the light emitting devices 20 and may extend in the second direction X1 and/or the third direction X2. Each of the third common electrodes 43 is located between adjacent ones of the light emitting devices 20 and may extend in the second direction X1 and/or the third direction X2.

It should be noted that the first common electrodes 41, the second common electrodes 42, and the third common electrodes 43 are each located between different and adjacent ones of the light emitting devices 20, and only one of the first common electrode 41, the second common electrode 42, and the third common electrode 43 is disposed between adjacent ones of the light emitting devices 20 in the second direction X1. Similarly, only one of the first common electrode 41, the second common electrode 42, and the third common electrode 43 is disposed between adjacent ones of the light emitting devices 20 in the third direction X2.

In one embodiment, referring to FIG. 2 in which a plurality of first common electrodes 41 extending in the second direction X1 and extending in the third direction X2, a plurality of second common electrodes 42 extending in the second direction X1, and a plurality of third common electrodes 43 extending in the third direction X2 are shown. Further, in the third direction X2, each of the second common electrodes 42 is located between adjacent ones of the first common electrodes 41, and in the second direction X1, each of the third common electrodes 43 is located between adjacent ones of the first common electrodes 41.

In one embodiment, at least one light emitting device 20 arranged in the third direction X2 is provided between the second common electrode 42 and the first common electrode 41 adjacent to each other in the third direction X2, and at least one light emitting device 20 arranged in the second direction X1 is provided between the third common electrode 43 and the first common electrode 41 adjacent to each other in the second direction X1. In the present embodiment of the present application, an example in which two light emitting devices 20 arranged in the third direction X2 are provided between the second common electrode 42 and the first common electrode 41 adjacent to each other and two light emitting devices 20 arranged in the second direction X1 are provided between the third common electrode 43 and the first common electrode 41 adjacent to each other is taken for illustration. One repeating unit is surrounded by the first common electrode 41, the second common electrode 42, and the third common electrode 43, shown in FIG. 8, and each repeating unit includes four light emitting devices 20.

Figure 3:
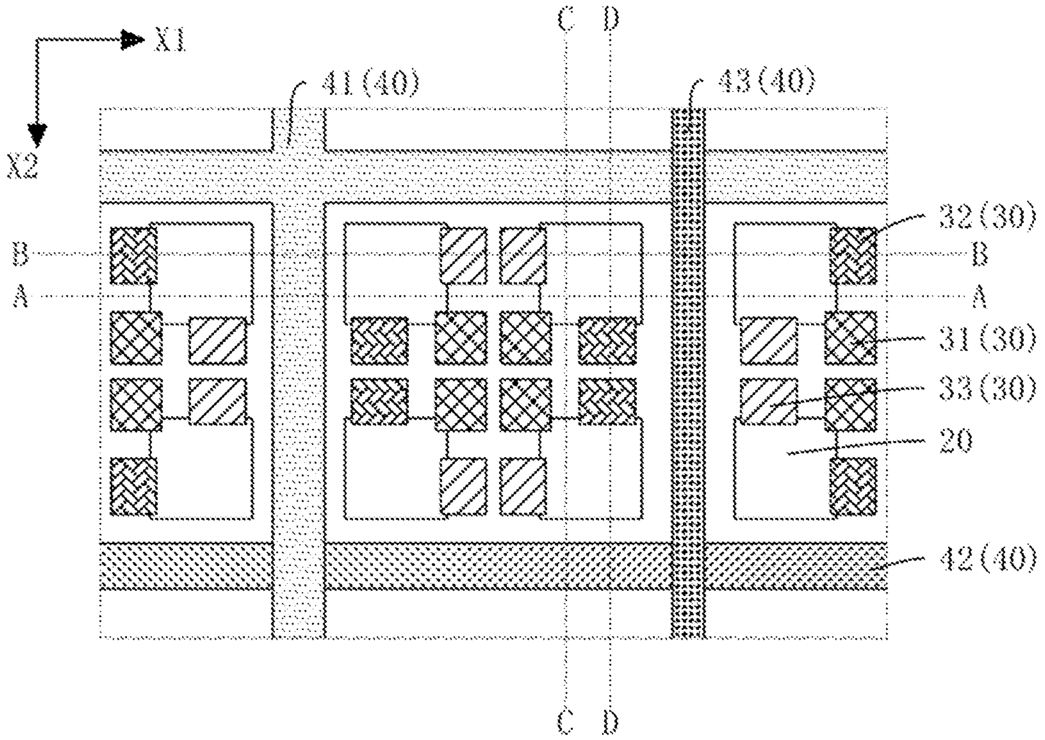
FIG. 3 is an enlarged structural schematic diagram of a position a of the display module of FIG. 2 of the embodiment of the present application.
Figure 8:
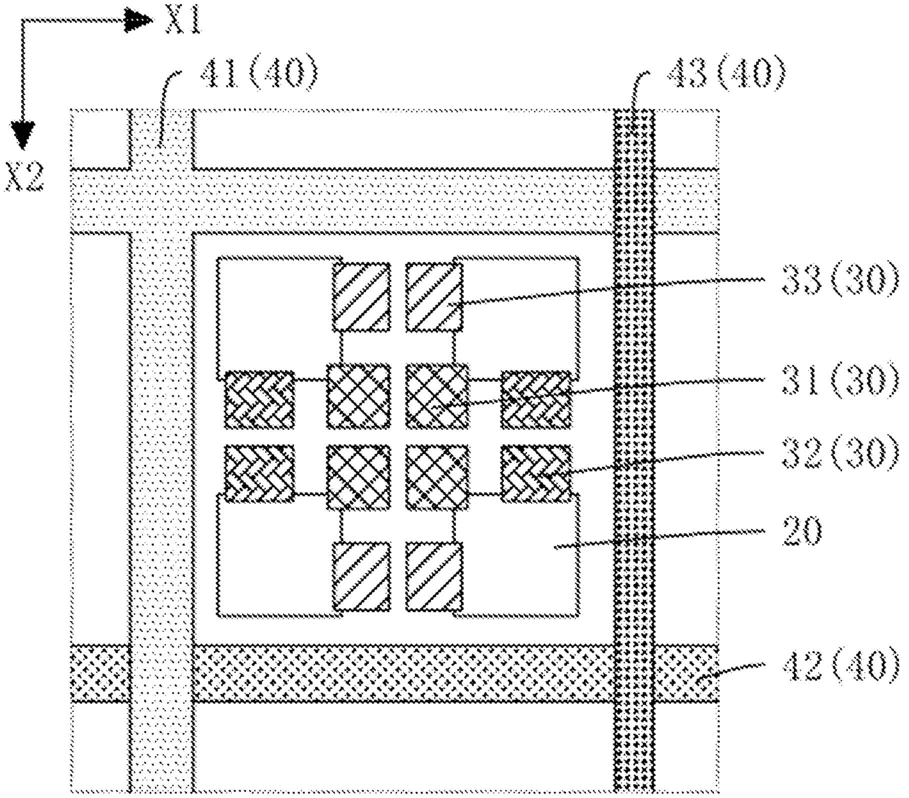
FIG. 8 is an enlarged structural schematic diagram of a position b of the display module of FIG. 2 of the embodiment of the present application.

Referring to FIGS. 3 and 8, in each repeating unit, each of the light emitting devices 20 includes one or more first sides opposite to the common electrodes 40 and one or more second sides, and an arrangement space at the second sides of the light emitting device 20 is greater than that at the first sides. In the embodiment of the present application, the independent electrodes 30 are provided on the second sides of each of the light emitting devices 20 so that the independent electrodes 30 are provided on the sides of the light emitting device 20 away from the common electrodes 40. Therefore, a sufficient space can be reserved for the arrangement of the independent electrodes 30 and avoid interference and interference between the independent electrodes 30 and the common electrodes 40.

It should be noted that each of the light emitting devices 20 may include two first sides and two second sides. That is, at least one side of each of the light emitting devices 20 is provided with one or more common electrodes 40, and a plurality of common electrodes 40 may be connected to each other to form a network structure. The light emitting device 20 or the above-mentioned repeating unit may be located in a mesh hole of the network structure, so that resistance of each of the common electrodes 40 may be reduced, thereby improving a voltage drop phenomenon of the common electrode 40.

It should be understood that, when at least one side of each of the light emitting devices 20 is provided with one or more common electrodes 40, the number of sides of the light emitting device 20 needs to be greater than or equal to the number of sub light emitting devices of the light emitting device 20. For example, when the number of sub light emitting devices of the light emitting device 20 is three, a shape of each of the sub light emitting devices or each of the light emitting devices 20 may be triangular, quadrilateral, or other polygon. For example, the shape of the light emitting device 20 is quadrilateral, as shown in FIG. 2.

Figure 9:
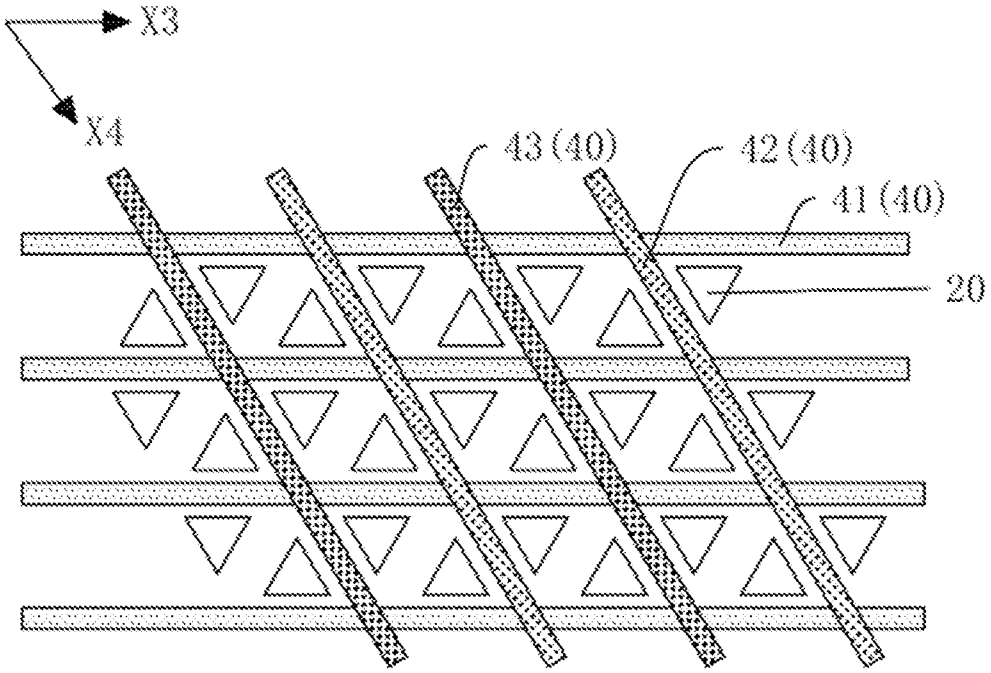
FIG. 9 is another schematic plan view of a display module according to an embodiment of the present application.

In one embodiment, referring to FIG. 9, the light emitting devices 20 may also be triangular in shape, a plurality of light emitting devices 20 are arranged in an array, two sides of each of the light emitting devices 20 are adjacent to one or more common electrodes 40, and the other side of each of the light emitting devices 20 may be provided with an independent electrode 30 (not shown). The arrangement direction of each of the common electrodes 40 may be parallel to the direction of adjacent one of the sides of the light emitting device 20 adjacent to the common electrode 40. The first common electrode 41 extends in a fourth direction X3 and is disposed opposite to the bottom side of the triangular light emitting device 20, and one first common electrode 41 is provided between any two adjacent rows of light emitting devices 20. The second common electrode 42 and the third common electrode 43 both extend in the fifth direction X4 and are disposed opposite to the sides of the triangular light emitting device 20.

Figure 10:
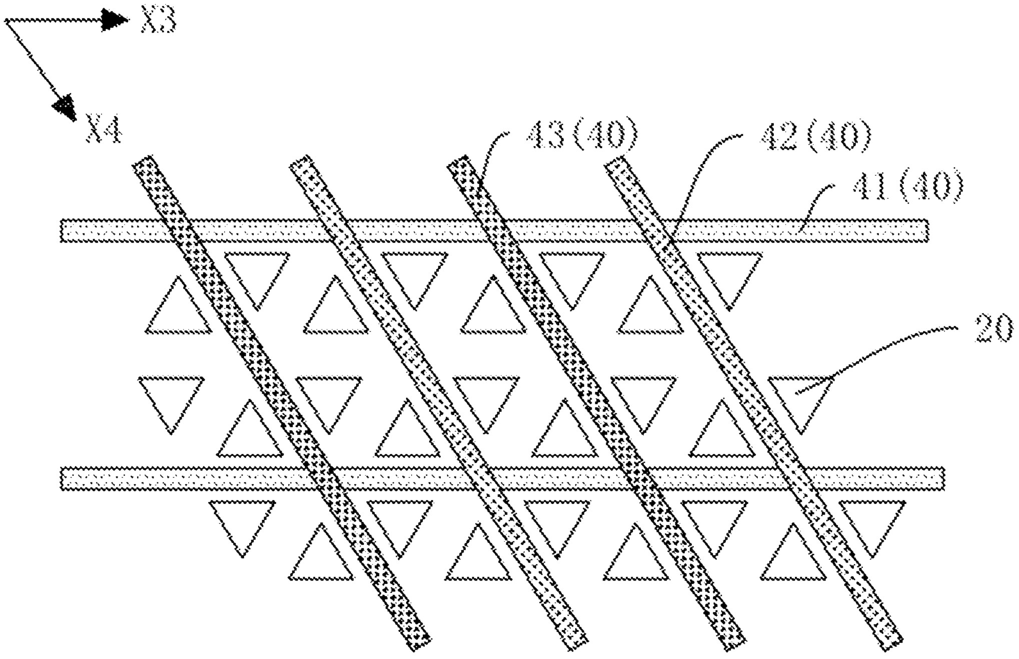
FIG. 10 is other schematic plan view of a display module according to an embodiment of the present application.

In another embodiment, referring to FIG. 10, the light emitting devices 20 are also triangular in shape, a plurality of light emitting devices 20 are arranged in an array, two sides of each of the light emitting devices 20 are adjacent to one or more common electrodes 40, and the other side of each of the light emitting devices 20 may be provided with an independent electrode 30 (not shown). The arrangement direction of each of the common electrodes 40 may be parallel to the direction of adjacent one of the sides of the light emitting device 20 adjacent to the common electrode 40. The first common electrode 41 extends in a fourth direction X3 and is disposed opposite to the bottom side of the triangular light emitting device 20, and one first common electrode 41 is provided between every two rows of light emitting devices 20. That is, two rows of light emitting devices 20 are provided between two adjacent first common electrodes 41. The second common electrode 42 and the third common electrode 43 both extend in the fifth direction X4 and are disposed opposite to the sides of the triangular light emitting device 20.

Figure 11:
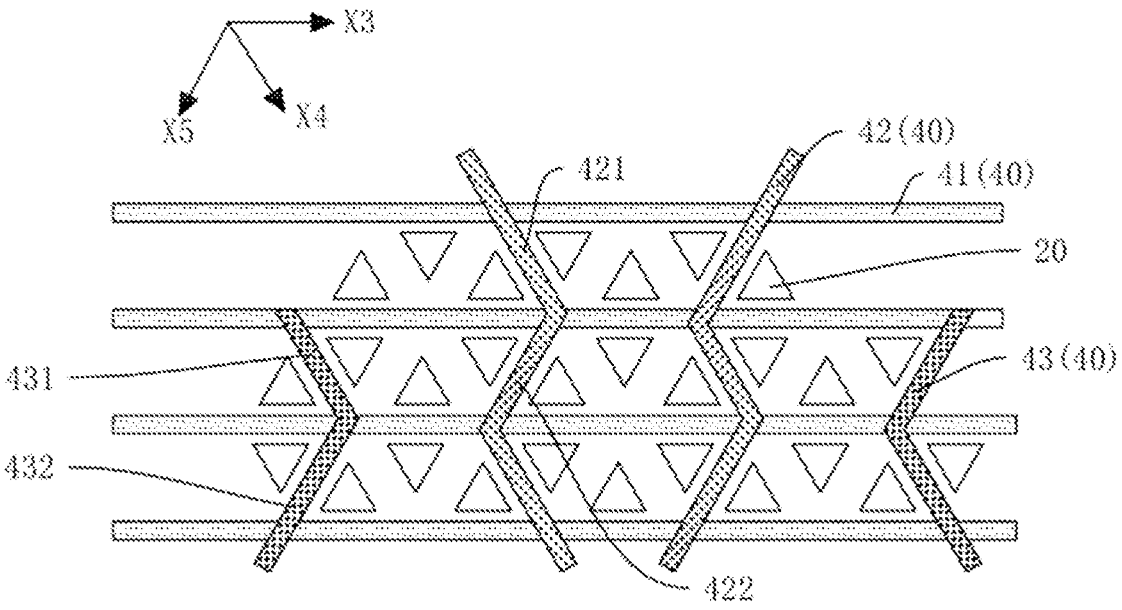
FIG. 11 is yet other schematic plan view of a display module according to an embodiment of the present application.

In another embodiment, referring to FIG. 11, the light emitting devices 20 are also triangular in shape, a plurality of light emitting devices 20 are arranged in an array, two sides of each of the light emitting devices 20 are adjacent to one or more common electrodes 40, and the other side of each of the light emitting devices 20 may be provided with an independent electrode 30 (not shown). The arrangement direction of each of the common electrodes 40 may be parallel to the direction of adjacent one of the sides of the light emitting device 20 adjacent to the common electrode 40. The first common electrode 41 extends in a fourth direction X3 and is disposed opposite to the bottom side of the triangular light emitting device 20, and one first common electrode 41 is provided between any two adjacent rows of light emitting devices 20. The second common electrode 42 and the third common electrode 43 both are disposed opposite to the sides of the triangular light emitting device 20. Specifically, the second common electrode 42 includes a first section 421 extending in a fifth direction X4 and a second section 422 extending in a sixth direction X5, and the first section 421 and the second section 422 are alternately arranged between adjacent ones of the light emitting devices 20. The third common electrode 43 includes a third section 431 extending in the fifth direction X4 and a fourth section 432 extending in the sixth direction X5, and the third section 431 and the fourth section 432 are alternately arranged between adjacent ones of the light emitting devices 20.

Figure 4:
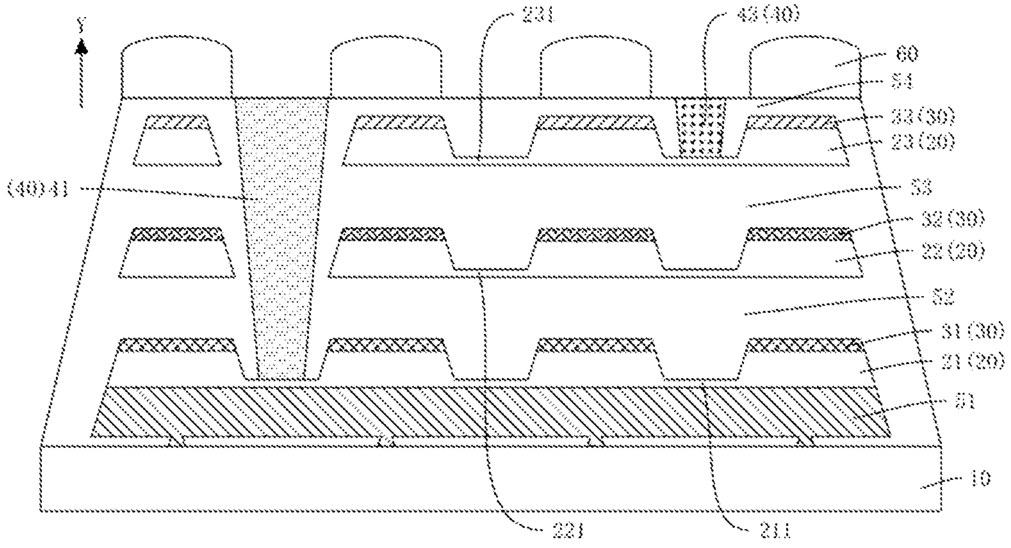
FIG. 4 is a cross-sectional structural schematic diagram of the display module of FIG. 3 of the embodiment of the present application taken along a line AA.
Figure 5:
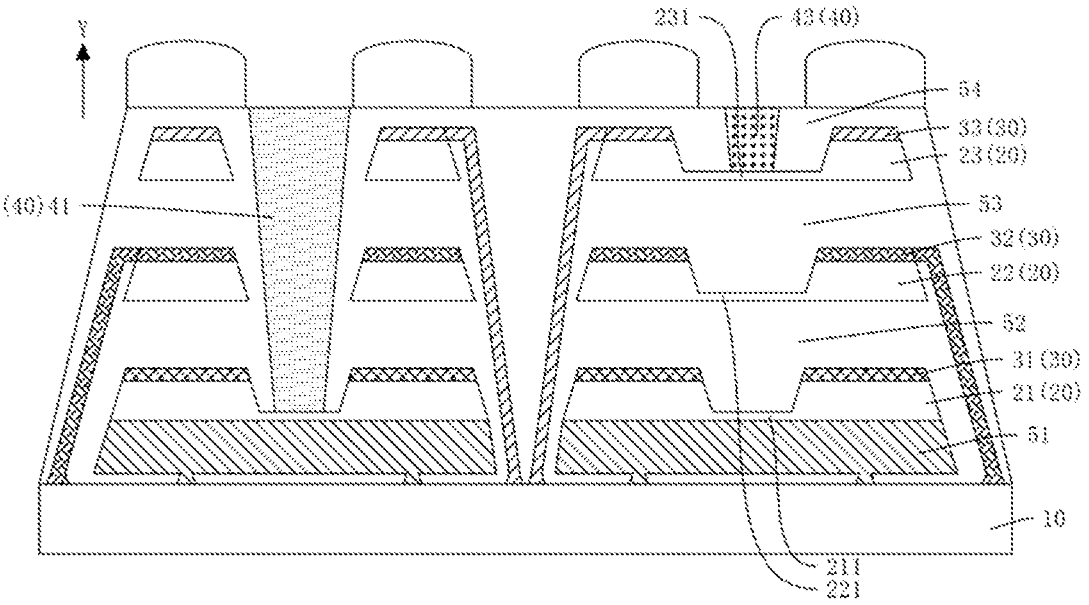
FIG. 5 is a cross-sectional structural schematic diagram of the display module of FIG. 3 of the embodiment of the present application taken along a line BB.
Figure 6:
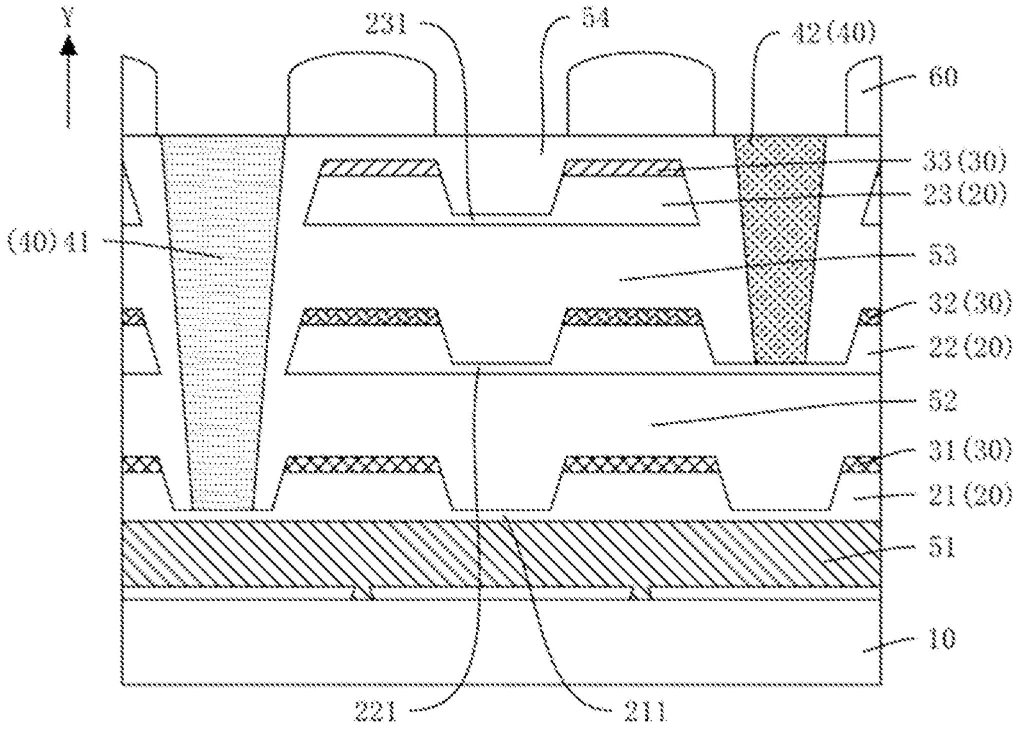
FIG. 6 is a cross-sectional structural schematic diagram of the display module of FIG. 3 of the embodiment of the present application taken along a line CC.
Figure 7:
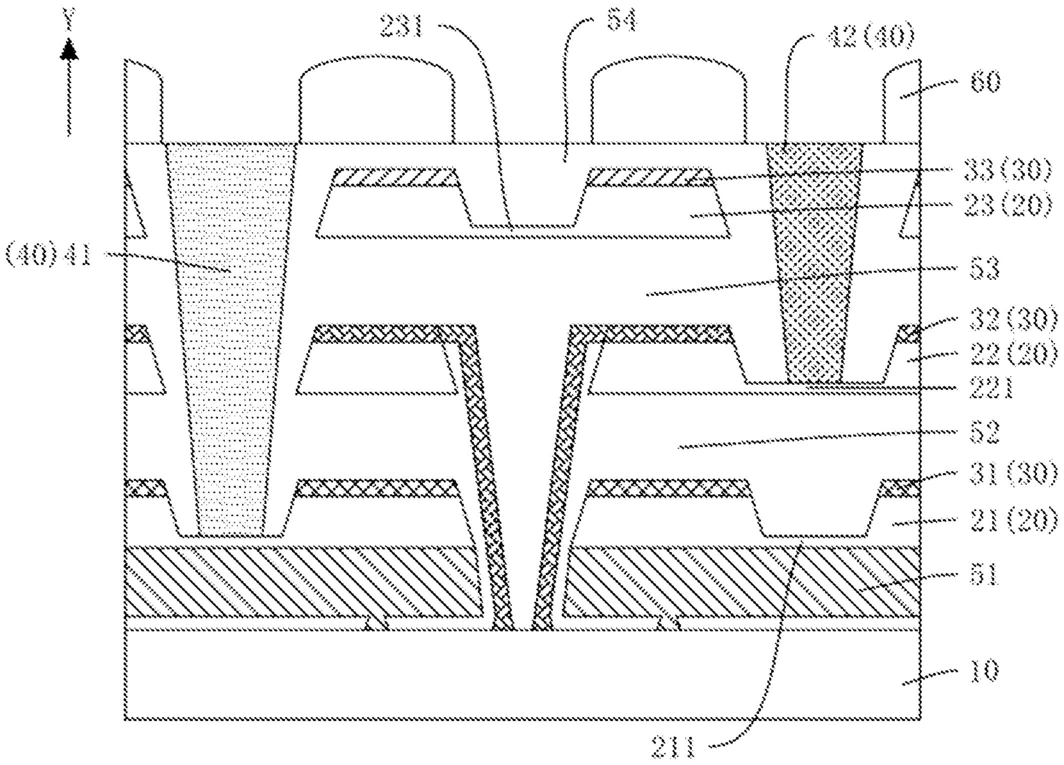
FIG. 7 is a cross-sectional structural schematic diagram of the display module of FIG. 3 of the embodiment of the present application taken along a line DD.

Referring to FIGS. 2, 3, 4, 5, 6 and 7, FIG. 4 is a cross-sectional structural schematic diagram of the display module of FIG. 3 of the embodiment of the present application taken along a line AA., FIG. 5 is a cross-sectional structural schematic diagram of the display module of FIG. 3 of the embodiment of the present application taken along a line CC, FIG. 6 is a cross-sectional structural schematic diagram of the display module of FIG. 3 of the embodiment of the present application taken along a line CC, and FIG. 7 is a cross-sectional structural schematic diagram of the display module of FIG. 3 of the embodiment of the present application taken along a line DD.

The independent electrodes 30 are disposed at least on an upper surface of each of the sub light emitting devices, the first independent electrode 31 is disposed on the upper surface of the first sub light emitting device 21 to be connected to the driving circuit unit in the substrate 10 through the first bonding layer 51, and the second independent electrode 32 is disposed on the upper surface of the second sub light emitting device 22 and connected to the driving circuit unit through the second bonding layer 52 and the first bonding layer 51, as shown in FIGS. 5 and 7. The third independent electrode 33 is disposed on the upper surface of the third sub light emitting device 23 and is connected to the driving circuit unit through the third bonding layer 53, the second bonding layer 52, and the first bonding layer 51, as shown in FIG. 5.

In one embodiment, the materials of the first independent electrode 31, the second independent electrode 32, and the third independent electrode 33 may include a transparent conductive material, such as an Indium Tin Oxide (ITO) material.

Further, the first common electrode 41 passes through the cover layer 54, the third bonding layer 53, and the second bonding layer 52 in the first direction Y and is connected to the first sub light emitting device 21, as shown in FIGS. 4 to 7. The second common electrode 42 passes through the cover layer 54 and the third bonding layer 53 in the first direction Y and is connected to the second sub light emitting device 22, as shown in FIGS. 6 and 7. The third common electrode 43 passes through the cover layer 54 in the first direction Y and is connected to the third sub light emitting device 23, as shown in FIGS. 4 and 5. Therefore, the thickness of the first common electrode 41 in the first direction Y is greater than that of the second common electrode 42 in the first direction Y, and the thickness of the third common electrode 43 in the first direction Y is less than that of the second common electrode 42 in the first direction Y.

Further, since a via hole through which the first common electrode 41 passes is the deepest, and a via hole through which the second common electrode 42 passes is the second, and a via hole through which the third common electrode 43 passes is the lowest, a width of an orthographic projection of the first common electrode 41 on the substrate 10 is greater than a width of an orthographic projection of the second common electrode 42 on the substrate 10, and the width of the orthographic projection of the second common electrode 42 on the substrate 10 is greater than a width of an orthographic projection of the third common electrode 43 on the substrate 10. The resistance of the first common electrode 41 can be effectively reduced, the voltage drop phenomenon can be improved, and uniformity of the signal transmission of the common electrode 40 can be improved.

Further, as shown in FIG. 2, there is an intersection position between any two of the first common electrode 41, the second common electrode 42, and the third common electrode 43. The first common electrode 41 may be provided at an intersection position between the first common electrode 41 and the second common electrode 42. That is, the first common electrode 41 may be provided at the intersection position between the first common electrode 41 and the second common electrode 42 and may pass through the cover layer 54, the third bonding layer 53, and the second bonding layer 52 in the first direction Y and be connected to the first sub light emitting device 21. The third common electrode 43 may be provided at an intersection position between the first common electrode 41 and the third common electrode 43. That is, the third common electrode 43 is provided at an intersection position between the first common electrode 41 and the third common electrode 43 and may pass through the cover layer 54 in the first direction Y and be connected to the third sub light emitting device 23. The third common electrode 43 may be provided at an intersection position between the second common electrode 42 and the third common electrode 43. That is, the third common electrode 43 is provided at an intersection position between the second common electrode 42 and the third common electrode 43, and may pass through the cover layer 54 in the first direction Y and be connected to the third sub light emitting device 23.

In other embodiments of the present application, the first common electrode 41 may be provided at an intersection position between the first common electrode 41 and either of the second common electrode 42 and the third common electrode 43, and the second common electrode 42 may be provided at an intersection position between the second common electrode 42 and the third common electrode 43, so that the resistances of the first common electrode 41 and the second common electrode 42 can be further reduced.

As shown in FIGS. 4, 6 and 7, when the common electrodes 40 and the independent electrodes 30 are not provided between two adjacent ones of the light emitting devices 20, sizes of the second sub light emitting device 22 and the third sub light emitting device 23 in one of the two adjacent light emitting devices 20 can be expanded toward the direction of the other light emitting device 20, so that the sizes of the second sub light emitting device 22 and the third sub light emitting device 23 are increased, thereby further increasing the light emitting area of the light emitting device 20. In addition, since the width of the third common electrode 43 is smaller, the size of the third sub light emitting device 23 adjacent to the third common electrode 43 can also be expanded toward the direction of the third common electrode 43. For example, for two first sub light emitting devices 21 located in the middle of FIG. 4, if no common electrode 40 is provided between the two first sub light emitting devices 21, then the sizes of the two first sub light emitting devices 21 can be expanded toward the direction in which the two first sub light emitting devices 21 are close to each other, so that the sizes of the two first sub light emitting devices 21 are increased. For two second sub light emitting devices 22 located in the middle, if no common electrode 40 is provided between the two second sub light emitting devices 22, then the sizes of the two second sub light emitting devices 22 may be expanded toward the direction in which the two second sub light emitting devices 22 are close to each other, so that the sizes of the two second sub light emitting devices 22 are increased. Similarly, for example, for two third sub light emitting devices 23 located on the right of FIG. 4, the common electrode 43 is provided between the two third sub light emitting devices 23. Since the width of the third common electrode 43 is smaller, the two third sub light emitting devices 23 can be expanded toward the direction in which the two third sub light emitting devices 23 are close to each other, so that the sizes of the two third sub light emitting devices 23 are increased. For example, in FIG. 6, the sizes of the two first sub light emitting devices 21 may be expanded toward the direction in which the two first sub light emitting devices 21 are close to each other, the sizes of the two second sub light emitting devices 22 may be expanded toward the direction in which the two second sub light emitting devices 22 are close to each other, and the two third sub light emitting devices 23 may be expanded toward the direction in which the two third sub light emitting devices 23 are close to each other, so that the sizes of the first sub light emitting devices 21, the second sub light emitting devices 22, and the third sub light-emitting devices 23 are increased. For example, in FIG. 7, the sizes of the two third sub light emitting devices 23 can be expanded toward the direction of the other light emitting device 20, so that the sizes of the third sub light emitting devices 23 are increased to increase the light emitting area of the light emitting device 20. Therefore, in the embodiment of the present application, the light emitting area and the opening rate of the light emitting device 20 can be effectively improved by designing the structure and the position of the common electrode 40.

It should be understood that, when the side of the light emitting device 20 is not provided with the common electrode 40 and the independent electrode 30, or is provided with the third common electrode 43, the size of the light emitting device 20 may be increased according to actual requirements. When both sides of the light emitting device 20 are provided with the common electrode 40 and/or the independent electrode 30, as shown in FIG. 5, the sizes of the first sub light emitting device 21, the second sub light emitting device 22, and the third sub light emitting device 23 are decreased in the direction of the substrate 10 toward the light emitting functional layer. However, in the embodiment of the present application, it is not necessary to form a step and an avoidance gap on the side surface of each of the light emitting devices 20. Therefore, the light emitting area of each of the light emitting devices 20 in the embodiment of the present application can be effectively improved with respect to the light emitting area of each of the LEDs in the display module shown in FIG. 1.

In one embodiment, an orthographic projection of the second sub light emitting device 22 on the substrate 10 is located within an orthographic projection of the first sub light emitting device 21 on the substrate 10, or the orthographic projection of the second sub light emitting device 22 on the substrate 10 coincides with the orthographic projection of the first sub light emitting device 21 on the substrate 10. An orthographic projection of the third sub light emitting device 23 on the substrate 10 is located in the orthographic projection of the second sub light emitting device 22 on the substrate 10, or the orthographic projection of the third sub light emitting device 23 on the substrate 10 coincides with the orthographic projection of the second sub light emitting device 22 on the substrate 10.

In one embodiment, the light emitting functional layer further includes a first connection member 211 connected between adjacent ones of the first sub light emitting devices 21, a second connection member 221 connected between adjacent ones of the second sub light emitting devices 22, and a third connection member 231 connected between adjacent ones of the third sub light emitting devices 23. The first common electrode 41 is connected to the first connection member 211, the second common electrode 42 is connected to the second connection member 221, and the third common electrode 43 is connected to the third connection member 231.

The thickness of the first common electrode 41 is larger, which can intercept the second connection member 221 and the third connection member 231. The third connection member 231 can be also intercept by the second common electrode 42. Therefore, in the present embodiment, the first connection member 211 is connected between any two adjacent ones of the first sub light-emitting devices 21, the second connection member 221 is connected between adjacent ones of some second sub light emitting devices 22, and the third connection member 231 is connected between adjacent ones of some third sub light emitting devices 23.

Specifically, the light emitting functional layer includes a plurality of first blocks 410 and a plurality of second blocks 420. Each of the first blocks 410 includes a plurality of second sub light emitting devices 22 and a second connection member 221 connected between adjacent ones of the second sub light emitting devices 22. Each of the second blocks 420 include a plurality of third sub light emitting devices 23 and a third connection member 231 connected between adjacent ones of the third sub light emitting devices 23. The first common electrode 41 is located between adjacent ones of the first blocks 410 and between adjacent ones of the second blocks 420, and the second common electrode 42 is located between adjacent ones of the second blocks 420. As shown in FIG. 2, each of the first blocks 410 is a region surrounded by the first common electrode 41 and may include, for example, four repeating units shown at a position a, and each of the second blocks 420 is a region surrounded by the first common electrode 41 and the second common electrode 42 and may include, for example, two repeating units shown at a position b.

In one embodiment, the first sub light emitting device 21, the second sub light emitting device 22, and the third sub light emitting device 23 may all be inorganic light emitting diode devices. A light emitting color of the first sub light emitting device 21 may be red, a light emitting color of the second sub light emitting device 22 may be green, and a light emitting color of the third sub light emitting device 23 may be blue to realize full color display of the display module. Since the blue light is a high energy light, when the blue light is irradiated onto the first sub light emitting device 21, it can cause the first sub light emitting device 21 to be excited when there is no need to emit light. Therefore, the first sub light emitting device 21 is provided at the lowermost layer of the display module in the embodiment of the present application, and the third sub light emitting device 23 is provided at the uppermost layer of the display module, so as to reduce the probability that the blue light is irradiated onto the first sub light emitting device 21, and increase the distance between the first sub light emitting device 21 and the third sub light emitting device 23. As such, the emergent light effect and the display effect of the display module can be effectively improved.

It can be understood that, since the light emitting efficiency of the red light in the inorganic light emitting diode is lower, the first sub light emitting device 21 located at the lowermost layer is set to emit red light. Since the first sub light emitting device 21 has the largest area, the light emitting efficiency of the red light emitted by the first sub light emitting device 21 can be compensated for. Further, when the sides of the second sub light emitting device 22 and the third sub light emitting device 23 are not provided with the common electrode 40 and the independent electrode 30, the size of the second sub light emitting device 22 and the size of the third sub light emitting device 23 may also be expanded toward the side having no common electrode 40 and independent electrode 30, and the light emitting areas of the second sub light emitting device 22 and the third sub light emitting device 23 may be increased according to actual requirements.

In one embodiment, the first sub light emitting device 21 may include a P-type GaP layer/P-type AlGaInP light emitting layer/AlGaInP layer/N-type AlGaInP layer/N-type GaAs layer, where the P-type may be Mg-doped, and the N-type may be Si-doped. The first connection member 211 may be formed of the P-type GaP layer or the N-type GaAs layer extending from the first sub light emitting device 21.

The second sub light emitting device 22 may include a P-type GaN layer/InGaN light emitting layer/N-type GaN layer, where the P-type may be Mg-doped, and the N-type may be Si-doped. The second connection member 221 may be formed of the P-type GaN layer or the N-type GaN layer extending from the second sub light emitting device 22.

The third sub light emitting device 23 may include a P-type GaN layer/InGaN light emitting layer/N-type GaN layer, where the P-type is generally Mg-doped, and the N-type is generally Si-doped. The third connection member 231 may be formed of the P-type GaN layer or the N-type GaN layer extending from the third sub light emitting device 23.

Further, in one embodiment, the second bonding layer 52 includes a first Bragg reflective layer to transmit the red light and reflect the blue light. The first Bragg reflective layer may be stacked film layers formed alternately of a silicon oxide layer and a titanium oxide layer, and the outermost layer of the first Bragg reflective layer may be entirely the silicon oxide layer, so that the second bonding layer 52 and the first Bragg reflective layer may be shared. That is, in the present embodiment, the blue light can be reflected by forming the first Bragg reflective layer above the first sub light emitting device 21 to prevent the blue light from being irradiated onto the first sub light emitting device 21, thereby further improving the emergent light effect of the light emitting device 20 and the display effect of the display panel.

In one embodiment, the third bonding layer 53 includes a second Bragg reflective layer to transmit the red light and the green light and reflect the blue light. The second Bragg reflective layer may be stacked film layers formed alternately of a silicon oxide layer and a titanium oxide layer, and the outermost layer of the first Bragg reflective layer may be the silicon oxide layer, so that the third bonding layer 53 and the first Bragg reflective layer may be shared. That is, in the present embodiment, the blue light can be reflected by forming the second Bragg reflective layer above the second sub light emitting device 22 to prevent the blue light from being irradiated onto the first sub light emitting device 21 and the second sub light emitting device 22, thereby further improving the emergent light effect of the light emitting device 20 and the display effect of the display panel.

Figure 12:
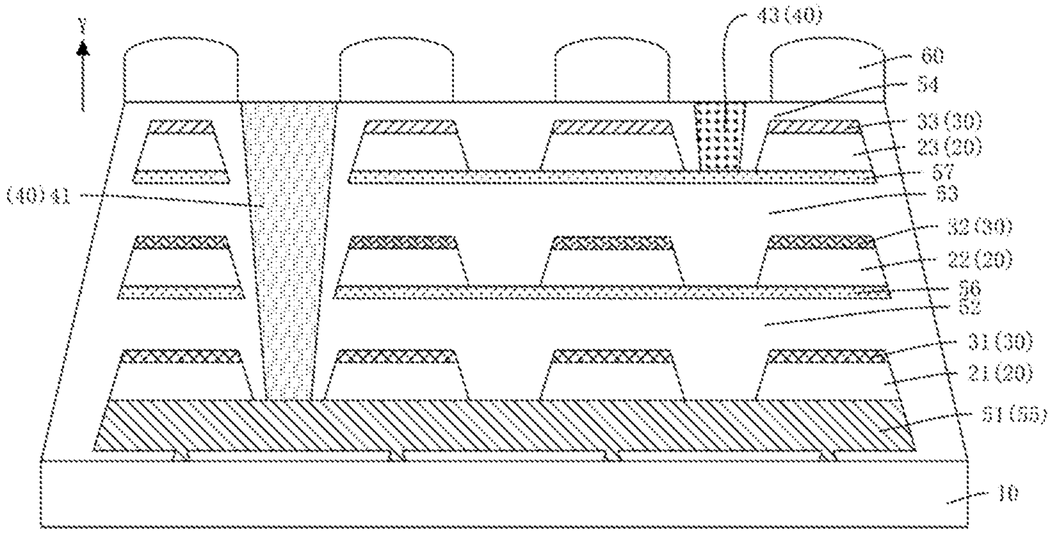
FIG. 12 is another cross-sectional structural schematic diagram of the display panel of FIG. 3 of the embodiment of the present application taken along the line AA.

In another embodiment of the present application, referring to FIG. 12, the first bonding layer 51 is multiplexed as a first bottom electrode 55, and the light emitting functional layer further includes a second bottom electrode 56 disposed between the second bonding layer 52 and the second sub light emitting device 22, and a third bottom electrode 57 disposed between the third bonding layer 53 and the third sub light emitting device 23. The first sub light emitting device 21 is disposed on the first bottom electrode 55, the second sub light emitting device 22 is disposed on the second bottom electrode 56, and the third sub light emitting device 23 is disposed on the third bottom electrode 57.

It should be understood that the first bottom electrode 55 may be continuously disposed under all the first sub light emitting devices 21. The second bottom electrode 56 may be separated by the first common electrode 41, so that the first bottom electrode 55 may be continuously distributed in the first block 410. The third bottom electrode 57 may be separated by the first common electrode 41 and the second common electrode 42, so that the third bottom electrode 57 may be continuously distributed in the second block 420.

The first common electrode 41 is connected to the first bottom electrode 55, the second common electrode 42 is connected to the second bottom electrode 56, and the third common electrode 43 is connected to the third bottom electrode 57. With the use of the common electrode 40 and the connection members (for example, the first connection member 211, the second connection member 221, and the third connection member 231) in FIGS. 4 to 7, the present embodiment can further reduce a connection resistance between the common electrode 40 and each of the light emitting devices 20, improve the signal transmission effect, and improve the light emitting effect of the light emitting device 20 and the display effect of the display module.

It should be noted that, in one embodiment of the present application, a common signal line (not shown) is provided in the driving circuit unit, and all of the first common electrode 41, the second common electrode 42, and the third common electrode 43 are connected to each other in the present application and can be connected to the common signal line in the driving circuit unit. The first sub light emitting device 21 is connected to the common signal line through the first connection member 211 and the first common electrode 41 sequentially, the second sub light emitting device 22 is connected to the common signal line through the second connection member 221 and the second common electrode 42 sequentially, and the third sub light emitting device 23 is connected to the common signal line through the third connection member 231 and the third common electrode 43 sequentially, so as to realize signal transmission. In addition, the first bonding layer 51 may also be connected to the common signal line on the basis of the bonding connection to the first sub light emitting device 21 so that the first sub light emitting device 21 may be connected to the common signal line through the first bonding layer 51.

In another embodiment of the present application, when the first bonding layer 51 is multiplexed as the first bottom electrode 55, the second bottom electrode 56 is provided between the second bonding layer 52 and the second sub light emitting device 22, and the third bottom electrode 57 is provided between the third bonding layer 53 and the third sub light emitting device 23, the first sub light emitting device 21 is connected to the common signal line through the first bottom electrode 55 and the first common electrode 41 sequentially, the second sub light emitting device 22 is connected to the common signal line through the second bottom electrode 56 and the second common electrode 42 sequentially, and the third sub-light-emitting device 23 is connected to the common signal line through the third bottom electrode 57 and the third common electrode 43 sequentially, so as to realize signal transmission. Further, the first bottom electrode 55 may also be connected to the common signal line, so that the first sub light emitting device 21 may be connected to the common signal line through the first bottom electrode 55.

In one embodiment, the materials of the second bottom electrode 56 and the third bottom electrode 57 may include transparent conductive materials, such as the ITO material.

It should be noted that the number of sub light emitting devices in each of the light emitting devices 20 in some embodiments of the present application is at least two, and the number of sub light emitting devices in each of the light emitting devices 20 in the above-described embodiment is three. In other embodiments of the present application, the number of sub light emitting devices in each of the light emitting devices 20 may also be two, four or more, which is not limited herein.

Figure 13:
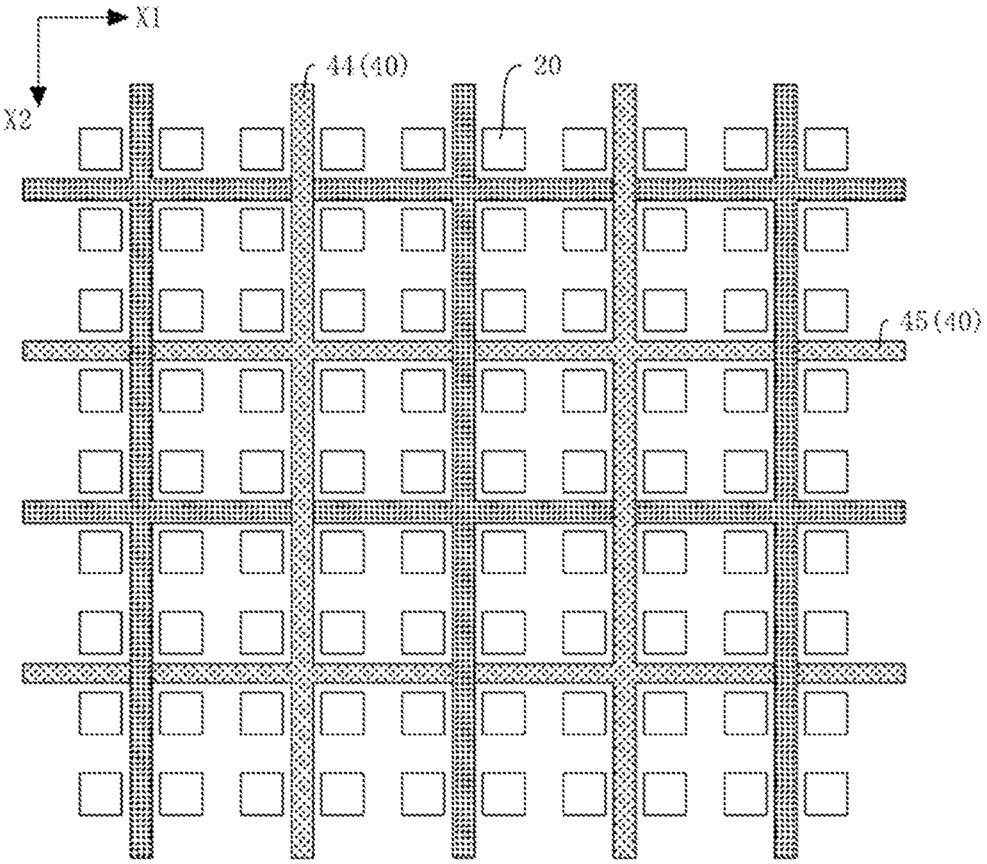
FIG. 13 is yet other schematic plan view of a display module according to an embodiment of the present application.

In another embodiment of the present application, as shown in FIG. 13, each of the light emitting devices 20 includes two sub light emitting devices arranged in the first direction Y, the plurality of independent electrodes includes two independent electrodes connected to the two sub light emitting devices, and the common electrode 40 includes a fourth common electrode 44 and a fifth common electrode 45 connected to the two sub light emitting devices, respectively. A plurality of light emitting devices 20 are arranged in an array in the second direction X1 and the third direction X2, a plurality of fourth common electrodes 44 are arranged in the second direction X1 and the third direction X2, a plurality of fifth common electrodes 45 are arranged in the second direction X1 and the third direction X2, and a plurality of fourth common electrodes 44 and a plurality of fifth common electrodes 45 are arranged in an intersecting manner to form a mesh structure, so as to effectively reduce the resistance of the common electrode 40. Both sides of each of the light emitting devices 20 are adjacent to the common electrode 40.

It should be noted that connections among the independent electrode 30, the common electrode 40, and the light emitting device 20 in the present embodiment can be made with reference to the above-described embodiments.

Further, the light emitting color of each of the sub light emitting devices connected to the fourth common electrode 44 may be green, and the light emitting color of each of the sub light emitting devices connected to the fifth common electrode 45 may be blue, and may be a combination of other colors, which is not limited thereto. The embodiments of the present application will be described by using only this example.

Figure 14:
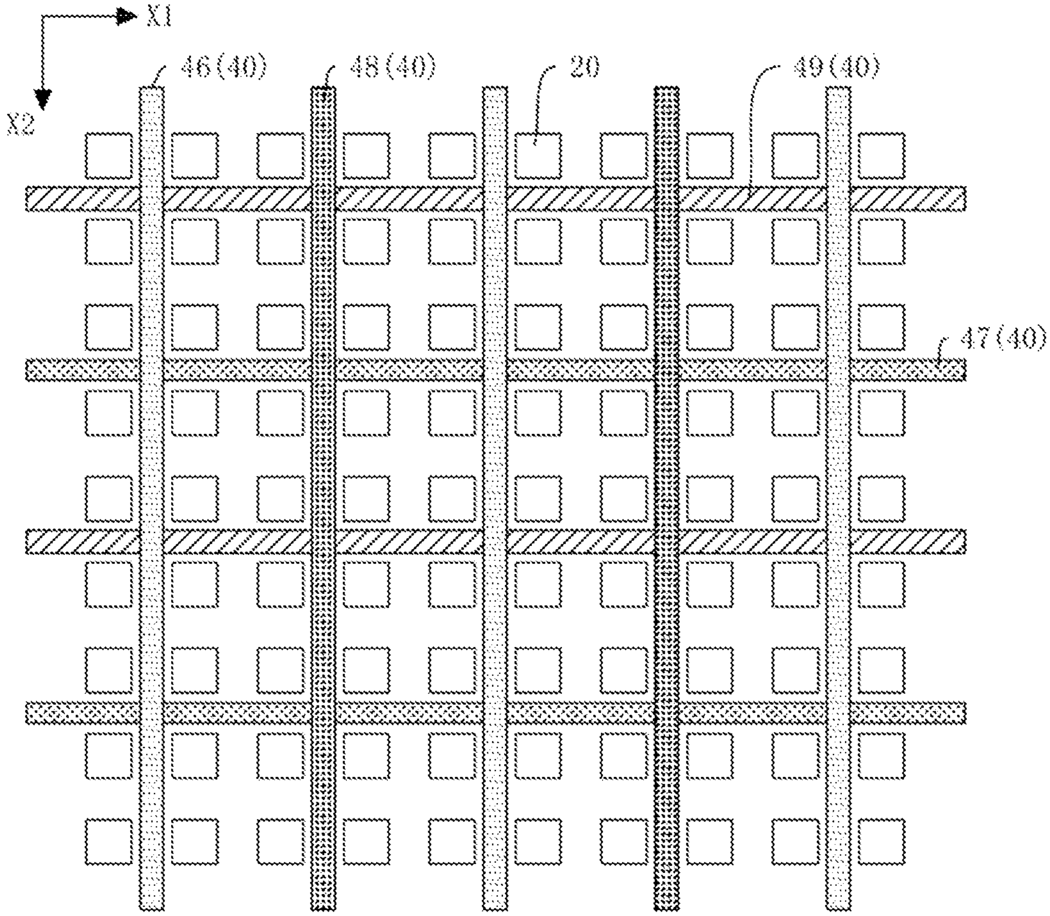
FIG. 14 is yet other schematic plan view of a display module according to an embodiment of the present application.

In another embodiment of the present application, referring to FIG. 14, each of the light emitting devices 20 may further include four sub light emitting devices arranged in the first direction Y, the plurality of independent electrodes includes four independent electrodes connected to the four sub light emitting devices, and the common electrode 40 includes a sixth common electrode 46, a seventh common electrode 47, an eighth common electrode 48, and a ninth common electrode 49 connected to the four sub light emitting devices, respectively. The sixth common electrode 46 and the eighth common electrode 48 may extend in the third direction X2, the seventh common electrode 47 and the ninth common electrode 49 may extend in the second direction X1. A plurality of sixth common electrodes 46, a plurality of seventh common electrodes 47, a plurality of eighth common electrodes 48 and a plurality of ninth common electrodes 49 are arranged in an intersecting manner to form a mesh structure, so that the resistance of the common electrode 40 can be effectively reduced.

It should be noted that the light emitting color of the sub light emitting device connected to the sixth common electrode 46 may be red, the light emitting color of the sub light emitting device connected to the seventh common electrode 47 may be green, the light emitting color of the sub light emitting device connected to the eighth common electrode 48 may be blue, and the light emitting color of the sub light emitting device connected to the ninth common electrode 49 may be yellow, and may be a combination of other colors, which is not limited thereto. The embodiment of the present application will be described by way of example only.

Further, in one embodiment, the light emitting functional layer further includes a plurality of lenses 60 disposed on the cover layer 54, and the plurality of lenses 60 may be disposed in one-to-one correspondence to the plurality of light emitting devices 20 so as to have a condensing effect on the emergent light of each of the light emitting devices 20, improve the emergent light intensity of the light emitting device 20 and the display brightness of the display module, effectively improve the display effect of the display module, and reduce the power consumption of the display module.

Continuing to the above description, in the process of implementation and application of the display module according to the embodiment of the present application, each of the common electrodes 40 is provided between adjacent ones of the light emitting devices 20 and connected to at least one of the sub light emitting devices in the first direction Y, so that the connection between the common electrode 40 and the at least one sub light emitting device is implemented, thereby avoiding arrangement of the step in the light emitting device 20 and reducing the difficulty of the process of accommodating the common electrode. Further, the yield of the display module can be improved, and the performance of the display module can be improved. In addition, in the embodiment of the present application, it is not necessary to form the step at the side of the light emitting device 20 and leave a gap at the step to keep a distance from the common electrode 40, and the common electrode 40 and the independent electrode 30 are located on different sides of the sub light-emitting device. Therefore, the embodiment of the present application can effectively improve the light emitting area of the light emitting device 20 and the opening ratio.

In addition, another embodiment of the present application further provides a display device, including a device body and the display module described in any one of the above-described embodiments, where the display module is integrated with the device body.

In one embodiment, the device body may include a frame, as well as other functional components, such as sensors, and the like.

The display device provided by the embodiment of the present application may include a direct-view display screen, a projector for home/office, and a portable electronic product, such as a smartphone, a notebook computer, a wearable electronic device, Augmented Reality (AR) and Virtual Reality (VR) glasses, and a retinal projection.

In the foregoing embodiments, descriptions of the embodiments are emphasized. A portion that is not described in detail in an embodiment may refer to related descriptions in another embodiment.

The display module and the display device provided in the embodiments of the present application are described in detail above. In this specification, principles and implementations of the present application are illustrated by applying specific examples herein. The description of the above embodiments is only used to help understand the technical solutions and core ideas of the present application; those of ordinary skill in the art should understand that it is still possible to modify the technical solutions recorded in the foregoing embodiments, and these modifications or replacements do not cause the essence of the corresponding technical solutions to deviate from the scope of the technical solutions of the embodiments of the present application.

What is claimed is:

1. A display module, comprising a substrate and a light emitting functional layer disposed on the substrate, wherein the light emitting functional layer comprises:

a plurality of light emitting devices, wherein each of the light emitting devices comprises at least two sub light emitting devices arranged in a first direction perpendicular to the substrate;

a plurality of independent electrodes respectively connected to the sub light emitting devices; and at least two common electrodes each disposed between adjacent ones of the light emitting devices, wherein the number of the common electrodes is greater than or equal to the number of the sub light emitting devices in each of the light emitting devices;

wherein the common electrodes are respectively connected to the sub light emitting devices in the first direction, one of the common electrodes and one of the independent electrodes are located on different sides of each of the sub light emitting devices, and each of the sub light emitting devices is electrically connected to at least one of the common electrodes.

2. The display module of claim 1, wherein each of the light emitting devices comprises a first sub light emitting device and a second sub light emitting device arranged in the first direction, the plurality of independent electrodes comprise a first independent electrode and a second independent electrode, and the at least two common electrodes comprise one or more first common electrodes and one or more second common electrodes; and wherein the first independent electrode and one of the first common electrodes are connected to different sides of the first sub light emitting device, and the second independent electrode and one of the second common electrodes are connected to different sides of the second sub light emitting device.

3. The display module of claim 2, wherein each of the light emitting devices further comprises a third sub light emitting device located on one side of the first sub light emitting device or one side of the second sub light emitting device in the first direction, the plurality of independent electrodes comprise a third independent electrode connected to the third sub light emitting device, the plurality of common electrodes comprise one or more third common electrodes each connected to the third sub light emitting device in the first direction, and the third common electrodes, the first common electrodes, and the second common electrodes are connected to each other.

4. The display module of claim 3, wherein the number of the first common electrodes, the number of the second common electrodes, and the number of the third common electrodes are all greater than or equal to 1.

5. The display module of claim 3, wherein the plurality of light emitting devices are arranged in a second direction and a third direction both parallel to the substrate, the first common electrodes extend in the second direction and/or the third direction, the second common electrodes extend in the second direction and/or the third direction, and the third common electrodes extends in the second direction and/or the third direction.

6. The display module of claim 3, wherein the first sub light emitting device is located between the substrate and the second sub light emitting device, the third sub light emitting device is located on a side of the second sub light emitting device away from the first sub light emitting device, a thickness of each of the first common electrodes in the first direction is greater than a thickness of each of the second common electrodes in the first direction, and a thickness of each of the third common electrodes in the first direction is less than the thickness of the second common electrode in the first direction.

7. The display module of claim 6, wherein the substrate comprises a driving circuit unit, and the light emitting functional layer further comprises a first bonding layer disposed between the substrate and the first sub light emitting device, a second bonding layer disposed between the first sub light emitting device and the second sub light emitting device, a third bonding layer disposed between the second sub light emitting device and the third sub light emitting device, and a cover layer disposed on a side of the third sub light emitting device away from the second sub light emitting device; and wherein each of the first common electrodes passes through the cover layer, the third bonding layer, and the second bonding layer in the first direction and is connected to the first sub light emitting device, each of the second common electrodes passes through the cover layer and the third bonding layer in the first direction and is connected to the second sub light emitting device, each of the third common electrodes passes through the cover layer in the first direction and is connected to the third sub light emitting device, and the first common electrodes, the second common electrodes, and the third common electrodes are all connected to the driving circuit unit.

8. The display module of claim 7, wherein the light emitting functional layer further comprises a first connection member connected between adjacent ones of the first sub light emitting devices, a second connection member connected between adjacent ones of the second sub light emitting devices, and a third connection member connected between adjacent ones of the third sub light emitting devices, and each of the first common electrodes is connected to the first connection member, each of the second common electrodes is connected to the second connection member, and each of the third common electrodes is connected to the third connection member; and wherein the first connection member is connected between any two adjacent ones of the first sub light emitting devices, the second connection member is connected between adjacent ones of a portion of the second sub light emitting devices, and the third connection member is connected between adjacent ones of a portion of the third sub light emitting devices.

9. The display module of claim 8, wherein the light emitting functional layer comprises a plurality of first blocks and a plurality of second blocks, each of the first blocks comprises a plurality of second sub light emitting devices and the second connection member connected between adjacent ones of the second sub light emitting devices, and each of the second blocks comprises a plurality of third sub light emitting devices and the third connection member connected between adjacent ones of the third sub light emitting devices; and wherein each of the first common electrodes is located between adjacent ones of the first blocks and between adjacent ones of the second blocks, and each of the second common electrodes is located between adjacent ones of the second blocks.

10. The display module of claim 7, wherein the first bonding layer is multiplexed as a first bottom electrode, and the light emitting functional layer further comprises a second bottom electrode disposed between the second bonding layer and the second sub light emitting device, and a third bottom electrode disposed between the third bonding layer and the third sub light emitting device, and the first sub light emitting device is disposed on the first bottom electrode, the second sub light emitting device is disposed on the second bottom electrode, and the third sub light emitting device is disposed on the third bottom electrode; and wherein each of the first common electrodes is connected to the first bottom electrode, each of the second common electrodes is connected to the second bottom electrode, and each of the third common electrodes is connected to the third bottom electrode.

11. The display module of claim 7, wherein a light emitting color of the first sub light emitting device is red, a light emitting color of the second sub light emitting device is green, and a light emitting color of the third sub light emitting device is blue.

12. The display module of claim 11, wherein the second bonding layer comprises a first Bragg reflective layer to transmit a red light and reflect a blue light.

13. The display module of claim 11, wherein the third bonding layer comprises a second Bragg reflective layer to transmit a red light and a green light and reflect a blue light.

14. The display module of claim 6, wherein a width of an orthographic projection of each of the first common electrodes on the substrate is greater than a width of an orthographic projection of each of the second common electrodes on the substrate, and the width of the orthographic projection of the second common electrode on the substrate is greater than a width of an orthographic projection of each of the third common electrodes on the substrate.

15. The display module of claim 6, wherein an orthographic projection of the second sub light emitting device on the substrate is located within an orthographic projection of the first sub light emitting device on the substrate, or the orthographic projection of the second sub light emitting device on the substrate coincides with the orthographic projection of the first sub light emitting device on the substrate; and wherein an orthographic projection of the third sub light emitting device on the substrate is located within an orthographic projection of the first sub light emitting device on the substrate, or the orthographic projection of the third sub light emitting device on the substrate coincides with the orthographic projection of the first sub light emitting device on the substrate.

16. The display module of claim 1, wherein one or more sides of each of the sub light emitting devices are provided with the common electrodes.

17. The display module of claim 16, wherein the number of the common electrodes is plural, and the plurality of common electrodes are connected to each other to form a mesh structure.

18. A display device, comprising a device body and a display module, wherein the display module is integrated with the device body; and wherein the display module comprises a substrate and a light emitting functional layer disposed on the substrate, and the light emitting functional layer comprises:

a plurality of light emitting devices, wherein each of the light emitting devices comprises at least two sub light emitting devices arranged in a first direction perpendicular to the substrate;

a plurality of independent electrodes respectively connected to the sub light emitting devices; and at least two common electrodes each disposed between adjacent ones of the light emitting devices, wherein the number of the common electrodes is greater than or equal to the number of the sub light emitting devices in each of the light emitting devices;

wherein the common electrodes are respectively connected to the sub light emitting devices in the first direction, one of the common electrodes and one of the independent electrodes are located on different sides of each of the sub light emitting devices, and each of the sub light emitting devices is electrically connected to at least one of the common electrodes.

19. The display device of claim 18, wherein each of the light emitting devices comprises a first sub light emitting device and a second sub light emitting device arranged in the first direction, the plurality of independent electrodes comprise a first independent electrode and a second independent electrode, and the at least two common electrodes comprise one or more first common electrodes and one or more second common electrodes; and wherein the first independent electrode and one of the first common electrodes are connected to different sides of the first sub light emitting device, and the second independent electrode and one of the second common electrodes are connected to different sides of the second sub light emitting device.

20. The display device of claim 19, wherein each of the light emitting devices further comprises a third sub light emitting device located on one side of the first sub light emitting device or one side of the second sub light emitting device in the first direction, the plurality of independent electrodes comprise a third independent electrode connected to the third sub light emitting device, the plurality of common electrodes comprise one or more third common electrodes each connected to the third sub light emitting device in the first direction, and the third common electrodes, the first common electrodes, and the second common electrodes are connected to each other.

* * * * *